United States Patent
Dean et al.

(10) Patent No.: US 7,543,184 B2
(45) Date of Patent: Jun. 2, 2009

(54) SYSTEM AND METHOD FOR DISTRIBUTING SYSTEM TESTS IN PARALLEL COMPUTING ENVIRONMENTS

(75) Inventors: Loren Dean, Natick, MA (US); Michael J. Thomas, Framingham, MA (US)

(73) Assignee: The MathWorks, Inc., Natick, MA (US)

( * ) Notice: Subject to any disclaimer, the term of this patent is extended or adjusted under 35 U.S.C. 154(b) by 414 days.

(21) Appl. No.: 11/438,866

(22) Filed: May 23, 2006

(65) Prior Publication Data

US 2007/0294581 A1 Dec. 20, 2007

(51) Int. Cl.
*G06F 11/00* (2006.01)
(52) U.S. Cl. ........................................ 714/32
(58) Field of Classification Search ............ 714/26, 714/27, 31, 32, 37, 38; 709/200, 202, 248–250, 709/310; 712/225–227, 235, 236
See application file for complete search history.

(56) References Cited

U.S. PATENT DOCUMENTS

| | | | |
|---|---|---|---|
| 7,055,137 B2 * | 5/2006 | Mathews | 717/125 |
| 7,167,453 B1 * | 1/2007 | Chopping et al. | 370/255 |
| 7,299,382 B2 * | 11/2007 | Jorapur | 714/38 |

OTHER PUBLICATIONS

Bertrand, Felipe et al., "Data Redistribution and Remote Method Invocation in Parallel Component Architectures," *Proceedings of the 19th IEEE International Parallel and Distributed Processing Symposium (IPDPS'05)* (2005).
Bertrand, Felipe et al., "DCA: A distributed CCA framework based on MPI," Proceedings of the Ninth International Workshop on High-Level Parallel Programming Models and Supportive Environments (HIPS'04) (2004).
Carpenter, Bryan et al., "Applications of HP Java," Languages and Compilers for Parallel Computing Lecture Notes in Computer Science, vol. 2958:147-161 (2004).
International Search Report for Application No. PCT/US2007/012238, dated Feb. 26, 2008.

* cited by examiner

*Primary Examiner*—Nadeem Iqbal
(74) *Attorney, Agent, or Firm*—Lahive & Cockfield, LLP; Kevin J. Canning

(57) ABSTRACT

A mechanism for the distribution of a test vector for a system test to a parallel computing environment is discussed. A test vector which controls the parameterization of a system test being conducted is provided as an input parameter to a function. In one implementation, the test vector is declared as a distributed array data type. The processing of the input test vector parameter causes the test vector to be distributed to the parallel computing units holding portions of the system under test. The test vector is then used in executing the system test. The results of the execution of the system test using the test vector may then be saved in a distributed array or returned to a client for presentment to a user.

23 Claims, 4 Drawing Sheets

SYSTEM AND METHOD FOR DISTRIBUTING SYSTEM TESTS IN PARALLEL COMPUTING ENVIRONMENTS

RELATED APPLICATION

This patent application is related to U.S. patent application Ser. No. 11/173,645 filed on Jun. 30, 2005, entitled "Distributed Arrays in Parallel Computing Environments", the contents of which are incorporated by reference in their entirety.

TECHNICAL FIELD

The present invention generally relates to parallel computing. More particularly, the present invention relates to the distribution of system tests in a parallel computing environment.

BACKGROUND

Engineers, scientists, mathematicians, and educators across a diverse range of industries solve engineering and scientific problems requiring large complex models using computer applications that provide technical computing environments. One such application which provides a technical computing environment is MATLAB, a product of The Math Works, Inc. of Natick, Mass. MATLAB® is a high performance language and a technical computing application that provides mathematical and graphical tools for mathematical computation, data analysis, visualization and algorithm development. MATLAB® integrates numerical analysis, matrix computation, signal processing, and graphics in an easy-to-use environment where problems and solutions are expressed in familiar mathematical notation, without traditional programming. MATLAB® is used to solve complex engineering and scientific problems by developing mathematical models that simulate the problem. A model is prototyped, tested and analyzed by running the model under multiple boundary conditions, data parameters, or a number of initial guesses.

As a desktop application, MATLAB® allows scientists and engineers to interactively perform complex analysis and modeling in a familiar workstation environment. However, a single workstation can be limiting due to the size of the problem that can be solved because of the relationship of the computing power of the workstation to the computing power necessary to execute computing intensive iterative processing of complex problems in a reasonable time. As problems require larger and more complex modeling, computations become more resource intensive and time-consuming. For example, a simulation of a large complex aircraft model may take a reasonable time to run with a single computation with a specified set of parameters. However, the analysis of the problem may also require the model be computed multiple times with a different set of parameters, e.g., at one-hundred different altitude levels and fifty different aircraft weights, to understand the behavior of the model under varied conditions. This would require five-thousand computations to analyze the problem as desired and the single workstation would take an unreasonable or undesirable amount of time to perform these simulations. Therefore, it is desirable to perform a computation concurrently using multiple workstations when the computation becomes so large and complex that it cannot be completed in a reasonable amount of time on a single workstation.

To address this problem of limited computing power being available on isolated systems, applications providing technical computing environments that are traditionally used as desktop applications, such as MATLAB®, are modified to be able to utilize the computing power of concurrent computing, such as parallel computing and parallel computing featuring distributed arrays. While this allows the problem being modeled to be distributed over a concurrent computing system, it presents a problem in that the conventional test techniques used to analyze models produced with stand-alone desktop applications were designed for the desktop environment. Similarly, tests designed for distributed non-parallel environments fail to take full advantage of parallel computing characteristics. Accordingly, as a result of the increased use of parallel computing and parallel computing featuring distributed arrays, a need has arisen to be able to perform system tests in parallel computing environments.

SUMMARY OF THE INVENTION

The illustrative embodiment of the present invention enables the distribution of a test vector for a system test to a parallel computing environment. A test vector which controls the parameterization of a system test is provided as an input parameter to a function. In one implementation, the test vector is declared as a distributed array data type. The test vector is distributed to the parallel computing units holding the portions of the system under test. The test vector is then used in executing the system test. The results of the execution of the system test using the test vector may then be saved in a distributed array or returned to a client for presentment to a user.

In one aspect of the present invention, a method for distributing system tests in a parallel computing environment includes the step of providing a first parallel computing unit in communication with a second parallel computing unit. The method also creates a test vector for a test to be executed on the first and second parallel computing units. Additionally, the method distributes the test vector to the first and second parallel computing units for simultaneous execution as a single job.

In another aspect of the present invention, a system for distributing system tests in a parallel computing environment includes an application providing a parallel computing environment. The parallel computing environment includes multiple parallel computing units that are communicating with one another. Additionally, the system includes a function for distributing a test vector to the multiple parallel computing units holding the distributed array. The function is executed simultaneously as a single job on the multiple parallel computing units.

BRIEF DESCRIPTION OF THE DRAWINGS

The invention is pointed out with particularity in the appended claims. The advantages of the invention described above, as well as further advantages of the invention, may be better understood by reference to the following description taken in conjunction with the accompanying drawings, in which:

DETAILED DESCRIPTION

Figure 1:
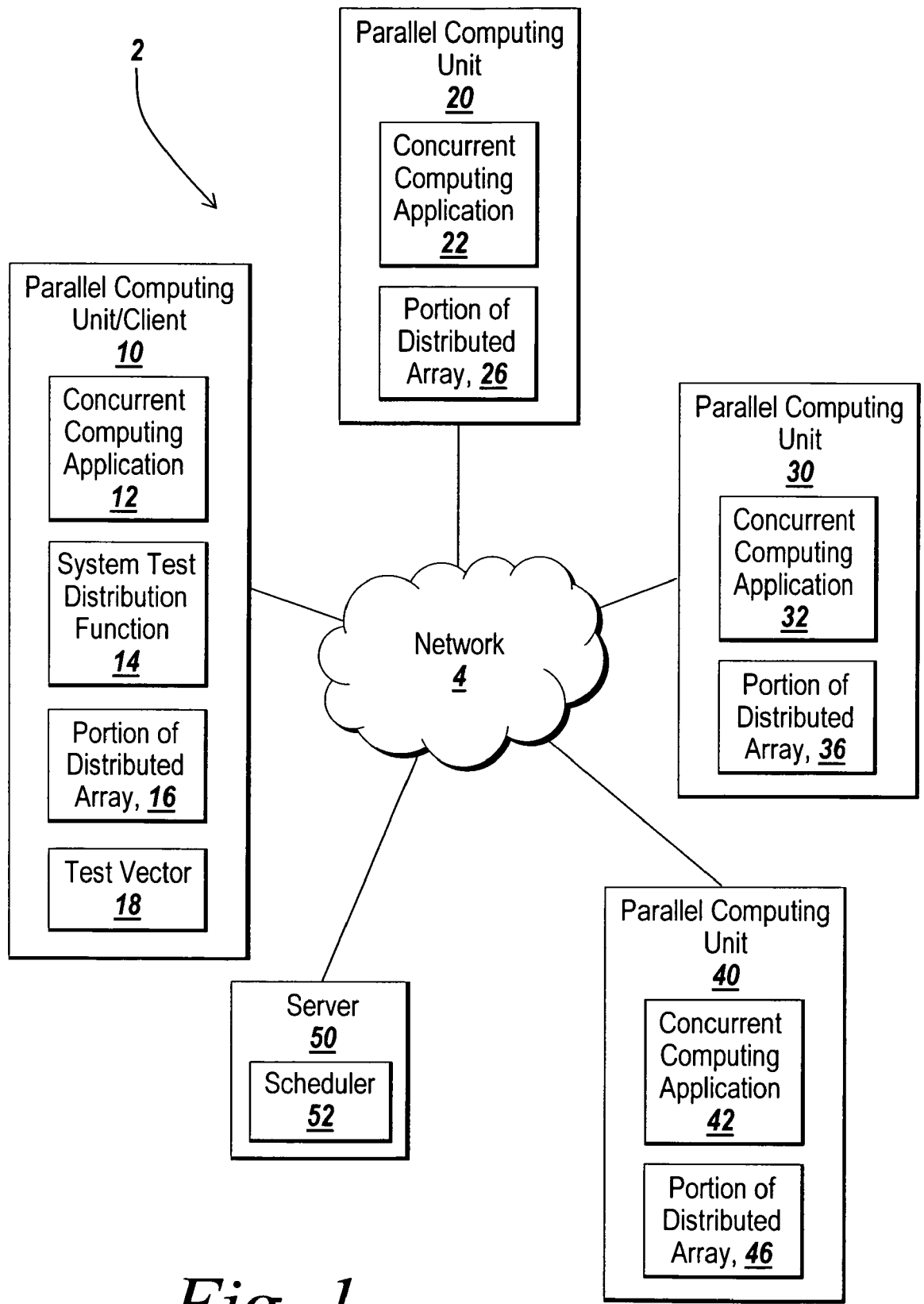
FIG. 1 depicts a parallel computing environment communicating over a network that is suitable for practicing the illustrative embodiment of the present invention.

The illustrative embodiment of the present invention enables the distribution of a test vector to parallel computing units. The present invention leverages the ability of technical computing environments that support distributed arrays to distribute test vectors for system tests. By declaring the test vector as a distributed array data type, the test vector may be provided as an input parameter to a system test function on a client parallel computing unit. The execution of the system test function includes the processing of the input test vector. The processing of the test vector results in the distribution of the test vector as a single job (which may have multiple tasks) to parallel computing units that each hold a portion of a system under test. The portion of the system under test may be held in a distributed array. Once distributed, the test vector is used to define the n-dimensional parameter space of the system that is being tested.

In order to better explain the present invention, it may be beneficial to first discuss the use of distributed arrays in parallel computing environments. It should be appreciated that although the illustrative embodiment of the present invention and the examples discussed herein reference a parallel MATLAB environment, the present invention may be applied to other technical parallel computing applications and environments such as LabVIEW® or MATRIXx from National Instruments, Inc., Mathematica® from Wolfram Research, Inc., or Mathcad of Mathsoft Engineering & Education Inc., or Maple™ from Maplesoft, a division of Waterloo Maple Inc.

With the availability of parallel computers, such as Beowolf clusters, researchers and scientists have become interested in parallel computing in technical computing environment, such as MATLAB®. Arrays are an integral part of technical computing, and with distributed arrays, a user can employ more computing resources than by using only a single computer. For a computer program utilizing a distributed array, the distributed array is distributed across multiple execution environments and each execution environment handles execution and calculation only on a portion of the distributed array. This provides an easy method for parallel processing of a distributed array executing on multiple computers and/or multiple processors to leverage the computing power of multiple computing resources. This is done without requiring the user of the parallel computing environment to understand how to program parallel programming paradigms. A program written to be run sequentially in the execution environment is run in parallel in multiple environments with little or no changes to the program.

MATLAB allows a user to indicate the distributed property of a distributed array with an attribute as explained further in U.S. patent application Ser. No. 11/173,645 filed on Jun. 30, 2005, entitled "Distributed Arrays in Parallel Computing Environments", the contents of which are incorporated by reference in their entirety. An attribute in programming languages generally describes an abstract property of an entity. The value of an attribute indicates whether an entity has the corresponding abstract property. This implementation of a distributed array allowed the look and feel of a distributed array to be similar to most of the existing syntaxes of an array and does not require a user to learn how to use a new class in order to employ a distributed array.

A distributed array is implemented such that the executions of the distributed array are distributed among the multiple execution environments. Each of the parallel computing units stores locally a portion of the data contents of the distributed array. The multiple execution environments know which portion of the distributed array is stored on which of the multiple parallel computing units. A parallel computing unit performs execution only on the portion of the distributed array that is stored locally and if the parallel computing unit needs some portion of the distributed array that is not stored locally, it can send a message to other parallel computing units to request for the information needed.

In one implementation, the illustrative embodiment of the present invention declares a test vector as a distributed array data type to programmatically distribute the test vector to the parallel computing units performing the system test (as part of the handling of the distributed array data type). In another implementation, the test vector is provided to a scheduler for distribution to the parallel computing units. FIG. 1 depicts a distributed environment suitable for practicing the illustrative embodiment of the present invention. A parallel computing unit/client 10 communicates over a network 4 with other parallel computing units 20, 30 and 40. The network 4 may be the Internet, a local area network (LAN), a wide area network (WAN), a wireless network, an intranet, an extranet or some other type of network. Each of the parallel computing units 10, 20, 30, and 40 executes an instance of a concurrent computing application 12, 22, 32 and 42 such as PARALLEL MATLAB. Those skilled in the art will recognize that other concurrent computing applications having the functionality described herein such as LabVIEW® or MATRIXx from National Instruments, Inc., Mathematica® from Wolfram Research, Inc., or Mathcad of Mathsoft Engineering & Education Inc., or Maple™ from Maplesoft, a division of Waterloo Maple Inc., may be substituted for PARALLEL MATLAB without departing from the scope of the present invention.

The parallel computing units 10, 20, 30 and 40 may be separate computing devices such as workstations, servers, laptops, mainframes, PDAs, a cluster of devices operating together, or other devices able to support an instance of the concurrent computing application 12, 22, 32 and 42. The parallel computing unit/client 10, which is usually the only one of the parallel computing units 10, 20, 30 and 40 to include a user interface, also includes a system test distribution function 14. The parallel computing units 10, 20, 30 and 40 are capable of communicating with each other via an interface. For example, the parallel computing units 10, 20, 30 and 40 can communicate with each other by sending messages via a Message Passing Interface (MPI). MPI is a de facto standard for communication among the nodes running a parallel program on a distributed memory system. Implementation of the MPI specification permits programs with separate address spaces to synchronize with one another and move data from the address space of one process to that of another by sending and receiving messages. In another embodiment, the parallel computing units 10, 20, 30 and 40 may communicate via socket based communications over TCP/IP implementing a custom message specification or other available message communications projects that allow the parallel computing units to send and receive messages.

Each of the parallel computing units 10, 20, 30 and 40 may also hold a portion of a distributed array 16, 26, 36 and 46 prior to the distribution of the test vector 18 for the system test. As will be discussed further below, the parallel computing units 10, 20, 30 and 40 may also receive the distributed array 16, 26, 36 and 46 as part of the call of the system test distribution function 14. The test vector 18 may control the parameterization of a test being conducted on the portions 16, 26, 36 and 46 of the distributed array held by the parallel computing units. Alternatively, the test vector may control the parameterization of a system test being conducted by the parallel computing units that is not conducted on portions of a distributed array. Put another way, the test vector defines an n-dimensional space which must be swept through during the system test. The test vector 18 may be created with a distributed array data type (darray in PARALLEL MATLAB) and fed as an input argument to the system test distribution function 14. During the execution of the system test distribution function 14, the distributed attribute for the test vector is noted and the test vector 18 is automatically distributed to the parallel computing units 10, 20, 30 and 40. Depending upon the implementation of the test system distribution function 14, the test system distribution function may identify a distributed array to be tested that is already present on the parallel computing units 10, 20, 30 and 40 that is selected for testing using the test vector 18. Alternatively, the system test distribution function 14 may distribute the portions 16, 26, 36 and 46 of a distributed array being tested during execution. Additionally, the distributed array attribute may cause the test vector 18 to be distributed to the parallel computing units 10, 20, 30 and 40 to be used to conduct a test on data accessible by the parallel computing units that is not stored in an array with distributed array properties.

The actions triggered by the execution of the system test distribution function 14 are distributed to the parallel computing units 10, 20, 30 and 40 as a single job to be executed simultaneously. The job may have multiple tasks. The distribution and replication of the job may utilize a separate scheduler 52 residing on a server 50 that is communicating over the network 4 with the parallel computing units 10, 20, 30 and 40. The parallel/concurrent computing environment 2 and the scheduler 52 allow one piece of code to be spread across an arbitrary number of processors so that each processor does the optimal amount of processing based upon the size of the problem being solved. Following execution of the system test using the test vector 18, the results may be stored in a separate distributed array on the parallel computing units 10, 20, 30 and 40 or communicated back over the network for presentment to a user accessing the parallel computing unit client 10. It will be appreciated by those skilled in the art that the number of parallel computing units may vary from the number shown in FIG. 1 without departing from the scope of the present invention. Similarly, it should be recognized that the parallel computing units may also be virtual devices.

Figure 2:
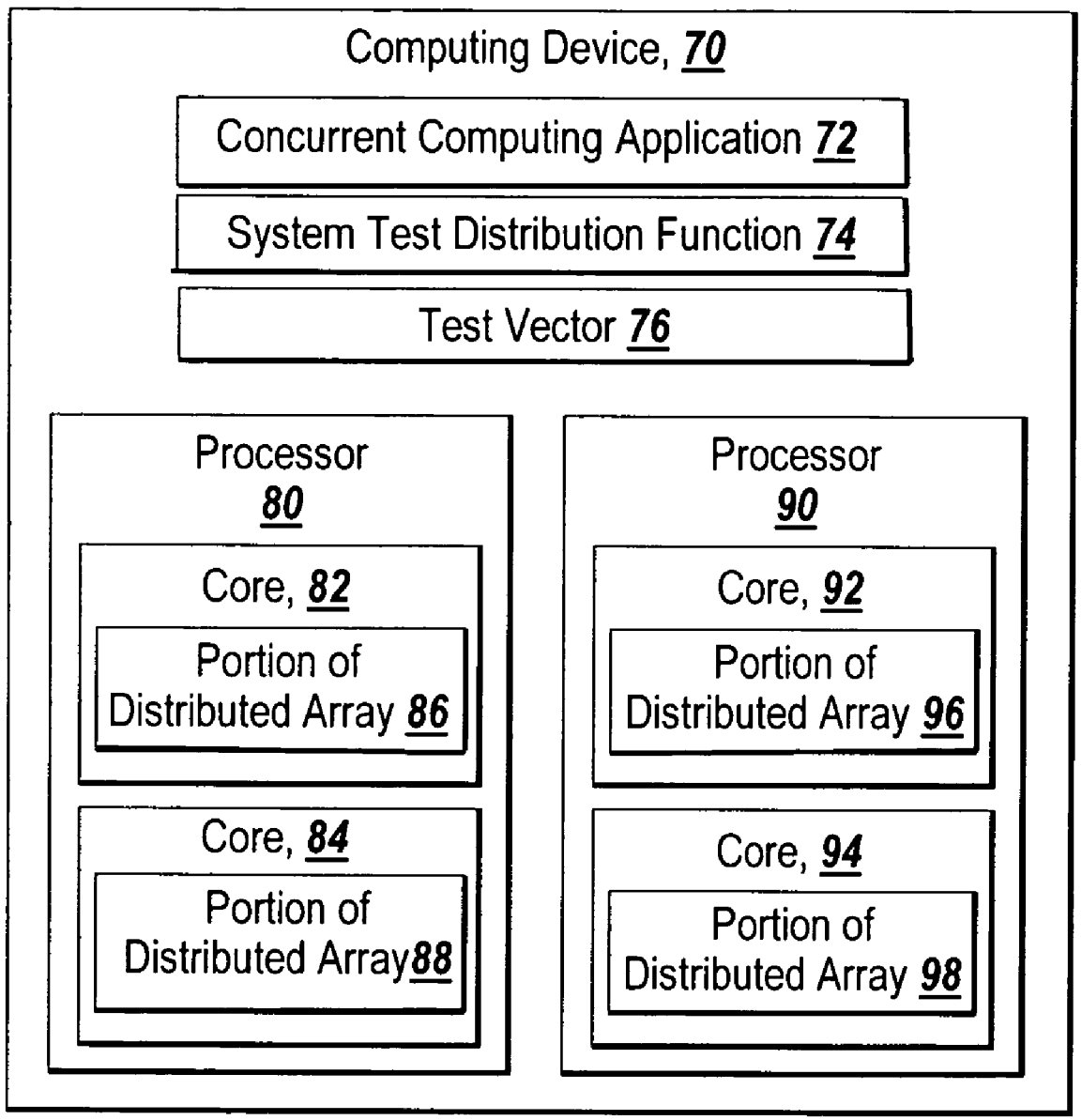
FIG. 2 depicts an alternate parallel computing environment suitable for practicing the illustrative embodiment of the present in which the parallel computing units are cores in a multi-processor, multi-core system.

The illustrative embodiment of the present invention may also be practiced in a tightly-coupled environment such as the one depicted in FIG. 2 where the processors share memory and a single bus. FIG. 2 depicts a multi-processor, multi-core computing device 70. The computing device 70 includes processors 80 and 90 equipped with cores 82 and 84 and 92 and 94 respectively. Each core may hold a portion of a distributed array 86, 88, 96 and 98 that is to be the subject of a system test. The computing device executes a concurrent computing application 72 such as PARALLEL MATLAB and includes the system test distribution function 74 and test vector 76. Instead of the use of a scheduler, the operating system may be used to distribute the job amongst the cores 82, 84, 92 and 94. Although depicted as a multi-processor, multi-core system, it will be appreciated that the illustrative embodiment of the present invention may also be executed on a multi-processor system where each processor has a single core. The parallel computing units may be a processor or other hardware component with computational capability, such as a microcontroller, application specific integrated circuit, or field-programmable gate arrays. Similarly, it will be appreciated that the computing devices utilized may have more than two processors and/or more than two cores.

Figure 3:
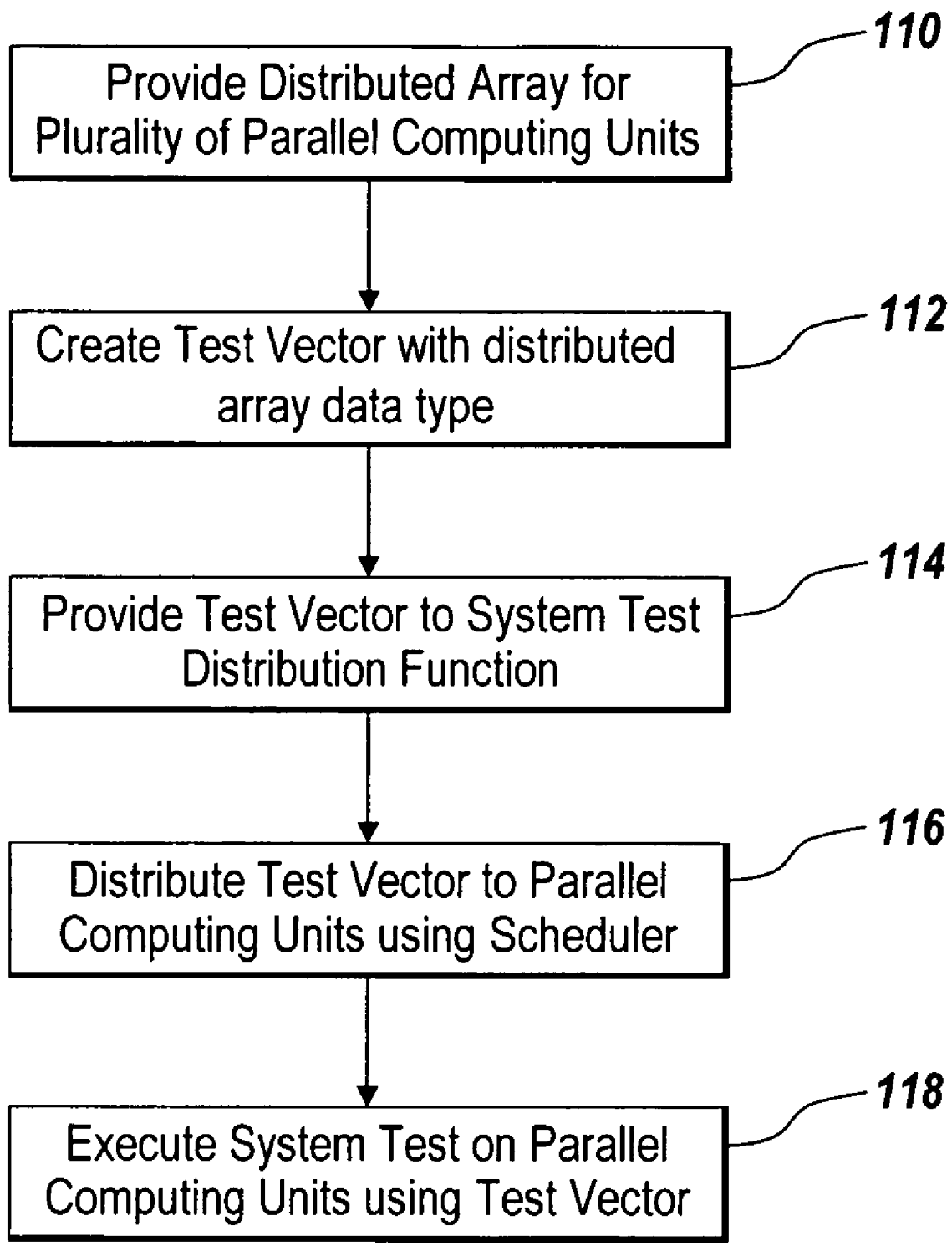
FIG. 3 is a flowchart of a sequence of steps followed by the illustrative embodiment of the present invention to distribute test vectors using a scheduler.

FIG. 3 is a flowchart of a sequence of steps that may be utilized by the illustrative embodiment of the present invention to distribute test vectors for a system test in a distributed environment. The sequence begins with the provision of a distributed array held by multiple parallel computing units (step 110). As noted above, the distributed array may be one that is already stored on the parallel computing units or the distributed array may be distributed as part of the system test function call. A test vector is then created with a distributed array data type, either by a user or programmatically (step 112). The test vector is provided to the system test distribution function (114) and distributed to the parallel computing units as part of the execution of the function using a job scheduler (step 116). The system test is then executed simultaneously on the parallel computing units using the test vector to control the parameterization of the test (step 118).

Figure 4:
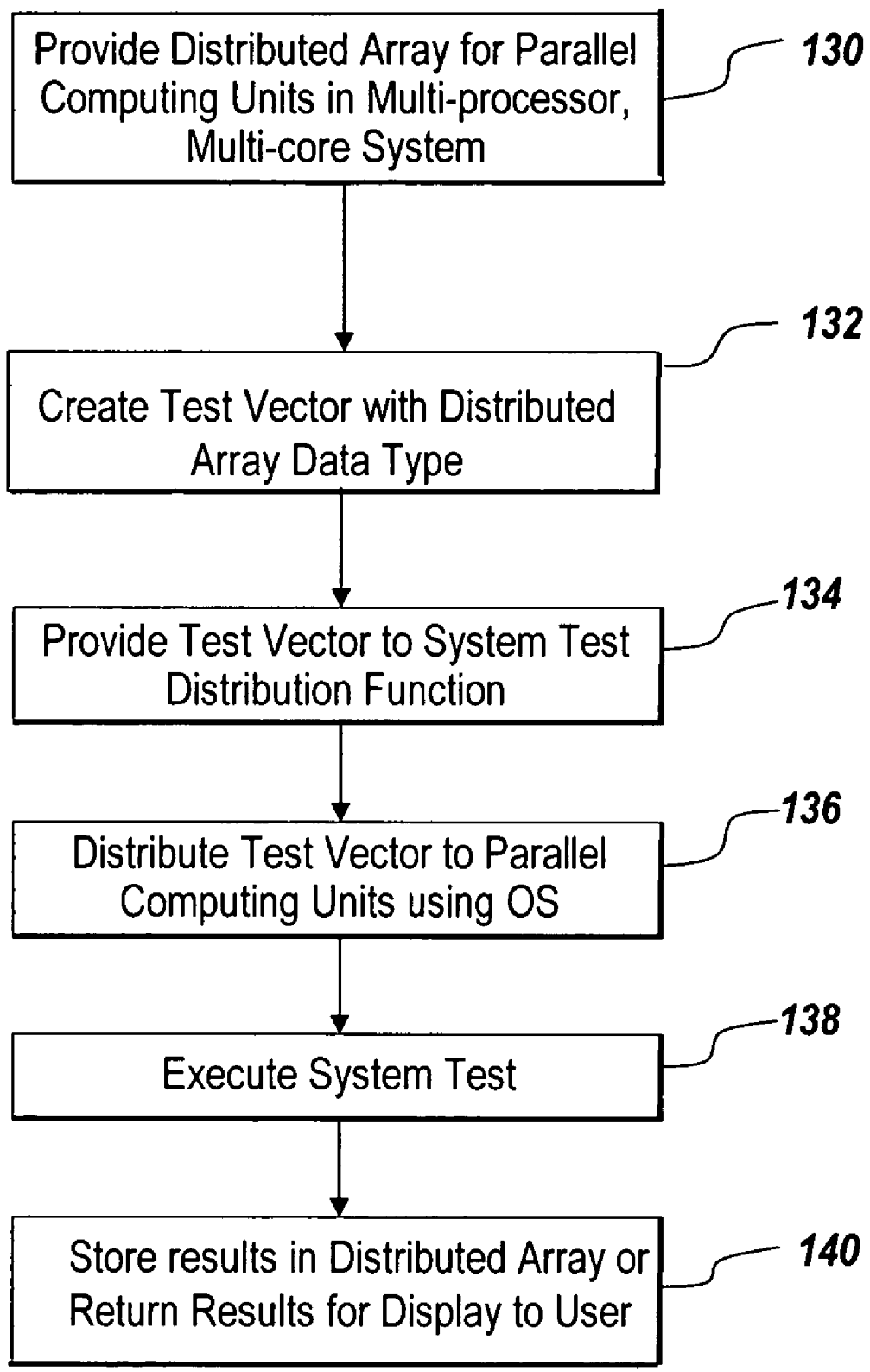
FIG. 4 is a flowchart of a sequence of steps followed by the illustrative embodiment of the present invention to distribute test vectors using the operating system of a multi-processor, multi-core computing device.

A corresponding sequence of steps which may be followed by the illustrative embodiment of the present invention in a tightly-coupled environment is described in FIG. 4. A distributed array for parallel computing units in a multi-processor, multi-core computing system is provided (step 130). A test vector is then created using the distributed array data type (step 132). The test vector is provided to the system test distribution function (step 134). The execution of system test distribution function results in the corresponding job being distributed to the parallel computing system by the operating system rather than by a separate scheduler process (step 136). The system test is executed using the test vector (step 138) and the results may be stored in a distributed array or returned for display to a user (step 140).

The present invention may be provided as one or more computer-readable programs embodied on or in one or more mediums. The mediums may be a floppy disk, a hard disk, a compact disc, a digital versatile disc, a flash memory card, a PROM, a RAM, a ROM, or a magnetic tape. In general, the computer-readable programs may be implemented in any programming language. Some examples of languages that can be used include MATLAB, FORTRAN, C, C++, C#, or JAVA. The software programs may be stored on or in one or more mediums as object code. Hardware acceleration may be used and all or a portion of the code may run on a FPGA or an ASIC. The code may run in a virtualized environment such as in a virtual machine. Multiple virtual machines running the code may be resident on a single processor.

Since certain changes may be made without departing from the scope of the present invention, it is intended that all matter contained in the above description or shown in the accompanying drawings be interpreted as illustrative and not in a literal sense. Practitioners of the art will realize that the sequence of steps and architectures depicted in the figures may be altered without departing from the scope of the present invention and that the illustrations contained herein are singular examples of a multitude of possible depictions of the present invention.

We claim:

1. A method for distributing system tests in a parallel computing environment that includes a plurality of parallel computing units, the method comprising:
   providing a first parallel computing unit;
   providing a second parallel computing unit in communication with the first parallel computing unit;
   receiving a first test vector for use in performing a system test executed on the first and second parallel computing units;
   receiving a second test vector for use in performing the system test, the second test vector including an identifier that identifies the second test vector as a distributed array data type;

distributing the first test vector to the first and second parallel computing units for simultaneous execution;

processing the identifier to determine whether the second test vector should be distributed to one or more of the first parallel computing unit and the second parallel computing unit;

distributing the second test vector to the determined one or more of the first parallel computing unit and the second parallel computing unit; and performing the system test:
using the first test vector executing on the first parallel computing unit and the second parallel computing unit, and
using the second test vector executing on the determined one or more of the first parallel computing unit and the second parallel computing unit.

2. The method of claim 1 wherein the performing produces one or more results that are stored in a distributed array.

3. The method of claim 1 wherein the first and second parallel computing units communicate using a Message Passing Interface (MPI).

4. The method of claim 1 wherein the first test vector or the second test vector is created by the first parallel computing unit.

5. The method of claim 1 wherein the first and second parallel computing units are different processors on the same computing device.

6. The method of claim 1 wherein the first and second parallel computing units are different cores of a processor on the same computing device.

7. The method of claim 1 wherein the parallel computing environment resides on a multi-core, multi-processor computing device.

8. The method of claim 1 wherein the first and second parallel computing units communicate over a network.

9. The method of claim 1 wherein the first test vector or the second test vector defines for testing an n-dimensional space in a distributed array.

10. The method of claim 1 wherein the first or second test vector is an input parameter for a function.

11. The method of claim 1 wherein at least one of the first parallel computing unit and second parallel computing unit is a virtual computing unit.

12. A medium holding computer-executable instructions for distributing system tests in a parallel computing environment that includes a plurality of parallel computing units, the medium holding one or more instructions for:

providing a first parallel computing unit;

providing a second parallel computing unit in communication with the first parallel computing unit;

receiving a first test vector for use in performing a system test to be executed on the first and second parallel computing units;

receiving a second test vector for use in performing the system test, the second test vector including an identifier that identifies the second test vector as a distributed data type;

distributing the first test vector to the first and second parallel computing units;

processing the identifier to determine whether the second test vector should be distributed to one or more of the first parallel computing unit and the second parallel computing unit;

distributing the second test vector to the determined one or more of the first parallel computing unit and the second parallel computing unit; and performing the system test:
using the first test vector executing on the first parallel computing unit and the second parallel computing unit, and
using the second test vector executing on the determined one or more of the first parallel computing unit and the second parallel computing unit.

13. The medium of claim 12 wherein the performing produces one or more results that are stored in a distributed array.

14. The medium of claim 12 wherein the first test vector or the second test vector defines for testing an n-dimensional space in a distributed array.

15. The medium of claim 12 wherein the first and second parallel computing units are different processors on the same computing device.

16. The medium of claim 12 wherein the first and second parallel computing units are different cores of a processor on the same computing device.

17. The medium of claim 12 wherein the parallel computing environment resides on a multi-core, multi-processor computing device.

18. A system for distributing system tests in a parallel computing environment, the system comprising:

a memory to:
store a first test vector for executing on a first parallel computing unit and a second parallel computing unit,
store a second test vector that includes an identifier that identifies the second test vector as a distributed array data type, where the identifier is used in determining whether the second test vector is executed on one or more of the first parallel computing environment and the second parallel computing environment,
code for performing a system test, and
code for distributing the first test vector or the second test vector; and a processor to:
evaluate the identifier,
determine whether the second test vector should be distributed to one or more of the first parallel computing unit and the second parallel computing unit based on the evaluating,
distribute, using the code for distributing:
the first test vector to the first parallel computing unit and the second parallel computing unit, and
the second test vector to the determined one or more of the first parallel computing unit and the second parallel computing unit, and perform the system test using:
the first test vector executing on the first parallel computing unit and the second parallel computing unit, and
the second test vector executing on the determined one or more of the first parallel computing environment and the second parallel computing environment.

19. The system of claim 18 wherein the second test vector is created by declaring a distributed array type variable.

20. The system of claim 18 wherein the performing produces one or more results that are stored in a distributed array.

21. The system of claim 18 wherein the first and second parallel computing units are different processors on the same computing device.

22. The system of claim 18 wherein the first and second parallel computing units are different cores of a processor on the same computing device.

23. The system of claim 18 wherein the parallel computing environment resides on a multi-core, multi-processor computing device.

* * * * *

UNITED STATES PATENT AND TRADEMARK OFFICE
CERTIFICATE OF CORRECTION

| | | |
|---|---|---|
| PATENT NO. | : 7,543,184 B2 | Page 1 of 1 |
| APPLICATION NO. | : 11/438866 | |
| DATED | : June 2, 2009 | |
| INVENTOR(S) | : Loren Dean et al. | |

It is certified that error appears in the above-identified patent and that said Letters Patent is hereby corrected as shown below:

Column 5, Line 26, in the printed patent "that is" should be --that are--.

Column 7, Line 17, in the printed patent "that are" should be --that is--.

Signed and Sealed this

Fourth Day of August, 2009

JOHN DOLL
*Acting Director of the United States Patent and Trademark Office*